(12) United States Patent
Sheldon et al.

(10) Patent No.: US 6,307,480 B1
(45) Date of Patent: Oct. 23, 2001

(54) INTEGRATED CIRCUIT RESET INCORPORATING BATTERY MONITOR AND WATCHDOG TIMER

(75) Inventors: Peter Sheldon; Paul Schnizlein; Alan Hendrickson, all of Austin, TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 08/914,017

(22) Filed: Aug. 1, 1997

Related U.S. Application Data

(63) Continuation of application No. 08/581,358, filed on Dec. 29, 1995, now abandoned.

(51) Int. Cl.[7] .................................................. G08B 21/00
(52) U.S. Cl. .......................... 340/636; 340/660; 340/661; 340/635; 455/127; 455/573; 395/559; 327/143
(58) Field of Search .................................. 340/635, 636, 340/660, 661; 327/143; 455/573, 127; 324/426, 427; 395/185.08, 555, 557, 559

(56) References Cited

U.S. PATENT DOCUMENTS

| | | | |
|---|---|---|---|
| 4,308,991 | * | 1/1982 | Peinetti et al. ..................... 236/46 R |
| 4,367,422 | * | 1/1983 | Leslie .................................. 327/143 |
| 4,434,403 | * | 2/1984 | Chang ................................. 327/20 |
| 4,551,841 | * | 11/1985 | Fujita et al. .......................... 371/66 |
| 4,560,937 | * | 12/1985 | Finger ................................. 324/433 |
| 4,572,966 | | 2/1986 | Hepworth ............................ 327/143 |
| 4,670,676 | * | 6/1987 | Nishitani ............................. 327/143 |
| 5,095,308 | * | 3/1992 | Hewitt ............................. 340/825.44 |
| 5,153,535 | * | 10/1992 | Fairbanks et al. ................... 331/143 |
| 5,164,613 | * | 11/1992 | Mumper et al. ..................... 327/143 |
| 5,203,000 | * | 4/1993 | Folkes et al. ....................... 395/750 |
| 5,237,698 | * | 8/1993 | Ohmae ................................ 395/750 |
| 5,446,403 | * | 8/1995 | Witkowski ......................... 327/143 |
| 5,519,346 | * | 5/1996 | Haddad et al. ..................... 327/143 |
| 5,818,201 | * | 10/1998 | Stockstad et al. ................... 320/119 |
| 5,870,617 | * | 2/1999 | Walsh et al. ..................... 395/750.6 |

FOREIGN PATENT DOCUMENTS

| | | |
|---|---|---|
| 580 341 A2 | 1/1994 | (EP) . |
| 666 669 A1 | 9/1995 | (EP) . |
| 6096238 | 8/1994 | (JP) . |
| WO 90/06552 | 6/1990 | (WO) . |

OTHER PUBLICATIONS

Schweber B., "Supervisory ICS Establish System Boundaries", *Electrical Design News*, vol. 40, No. 20, Sep. 28, 1995, pp. 71–72, 74, 76, 78, 81.

* cited by examiner

*Primary Examiner*—Daniel J. Wu

(57) ABSTRACT

A reset circuit that incorporates a battery monitor and watchdog timer in an integrated circuit is disclosed. A battery monitor having an output indicative of a charge state of a battery and a watchdog timer having an output indicative of an operational state of software being executed by the integrated circuit are connected to reset logic having a reset signal output, wherein the reset logic generates a reset signal on the reset signal output if either the battery monitor output or the watchdog timer output is active.

30 Claims, 2 Drawing Sheets

INTEGRATED CIRCUIT RESET INCORPORATING BATTERY MONITOR AND WATCHDOG TIMER

CROSS REFERENCE TO RELATED APPLICATIONS

This is a Continuation of application Ser. No. 08/581,358, filed Dec. 29, 1995 now abandoned.

This application is related to the following U.S. patent application: Ser. No. 09/110,798, Battery Monitor With Software Trim, Sheldon et al.

The related application is assigned to the assignee of the present invention and is incorporated in its entirety by this reference thereto.

BACKGROUND OF THE INVENTION

The present invention relates to an integrated circuit and, more particularly, to reset circuitry of an integrated circuit incorporating a battery monitor and watchdog timer.

In order for digital integrated circuits to operate properly, it is generally necessary to first cause the circuitry of the integrated circuit to start from a known state, before it performs other operations. Once the circuitry is in the known state, operations of the circuitry can then be conducted in an orderly and predictable fashion. Typically, this known state is called the reset state. According to particular design, the reset state may occur, for example, when power is first applied to the integrated circuit. Design may also cause the integrated circuit to be reset to the reset state while power is applied during operations for various reasons. In certain applications it is also desirable that the integrated circuit monitor various internal and external conditions and that the integrated circuit reset to the reset state if any of those conditions are not as expected for desired operation or raise questions about that operation.

One internal condition that may be, and frequently is, monitored for the aforementioned reasons is selected operational states of a microcontroller or other integrated circuits that execute instructions, such as microcode, firmware or software, incorporated in the integrated circuit. For appropriate operation of the integrated circuit the microcontroller must process instructions in an orderly fashion. It may happen, from time to time, that, through inadvertent errors in the instructions or circuitry, other unforseen events, or even other occurrences, the microcontroller or software controlling it operates in an unexpected or undesirable manner. When this occurs, it is in many instances desirable to reset the integrated circuit before allowing the microcontroller or software to resume normal operations.

In instances in which an integrated circuit is powered by a battery or other depleting power source, an external condition that may be monitored is the charge level in the battery. Monitoring the battery's charge level may be desirable because once the charge falls below a certain level, it may be hard, if not impossible, to predict the operation of the integrated circuit. In order to avoid the uncertainty in those cases, it may be desirable to cause the integrated circuit, or portions of it, to maintain a particular state or even shutdown when the charge level of the battery or other power source has depleted to a critical level.

The unpredictability of an integrated circuit powered by a battery having a low charge, or whose software is not operating properly, is of particular concern when the integrated circuit operates to control a wireless communication device, such as a portable phone or radio. This concern arises because of the need to prevent the device from sending out undesirable electromagnetic signals.

Heretofore, integrated circuits have utilized external battery monitors which have necessitated additional components on the system board as well as additional external pins on the integrated circuit. This has resulted in increased board space and greater expense, both of which conditions are undesirable with the increased need for miniaturization and decreased cost.

Therefore, what is needed is a reset circuit in an integrated circuit which incorporates a battery monitor and watchdog timer.

SUMMARY OF THE INVENTION

The present invention, accordingly, provides a reset circuit that incorporates a battery monitor and watchdog timer in an integrated circuit. To this end, a battery monitor having an output indicating a state of a battery and a watchdog timer having an output indicating a state of software being executed by the integrated circuit are connected to reset logic having a reset signal output, wherein the reset logic generates a reset signal on the reset signal output if either the battery monitor output or the watchdog timer output is active.

The reset circuit may also generate an oscillator disable signal to an oscillator when the battery monitor output indicates a low capacity state of the battery.

Additionally, the reset circuit may also include a reset defeat circuit, which either completely prevents the generation of the reset signal, or prevents the generation of the reset signal when the watchdog timer output is active.

DESCRIPTION OF THE PREFERRED EMBODIMENTS

Figure 1:
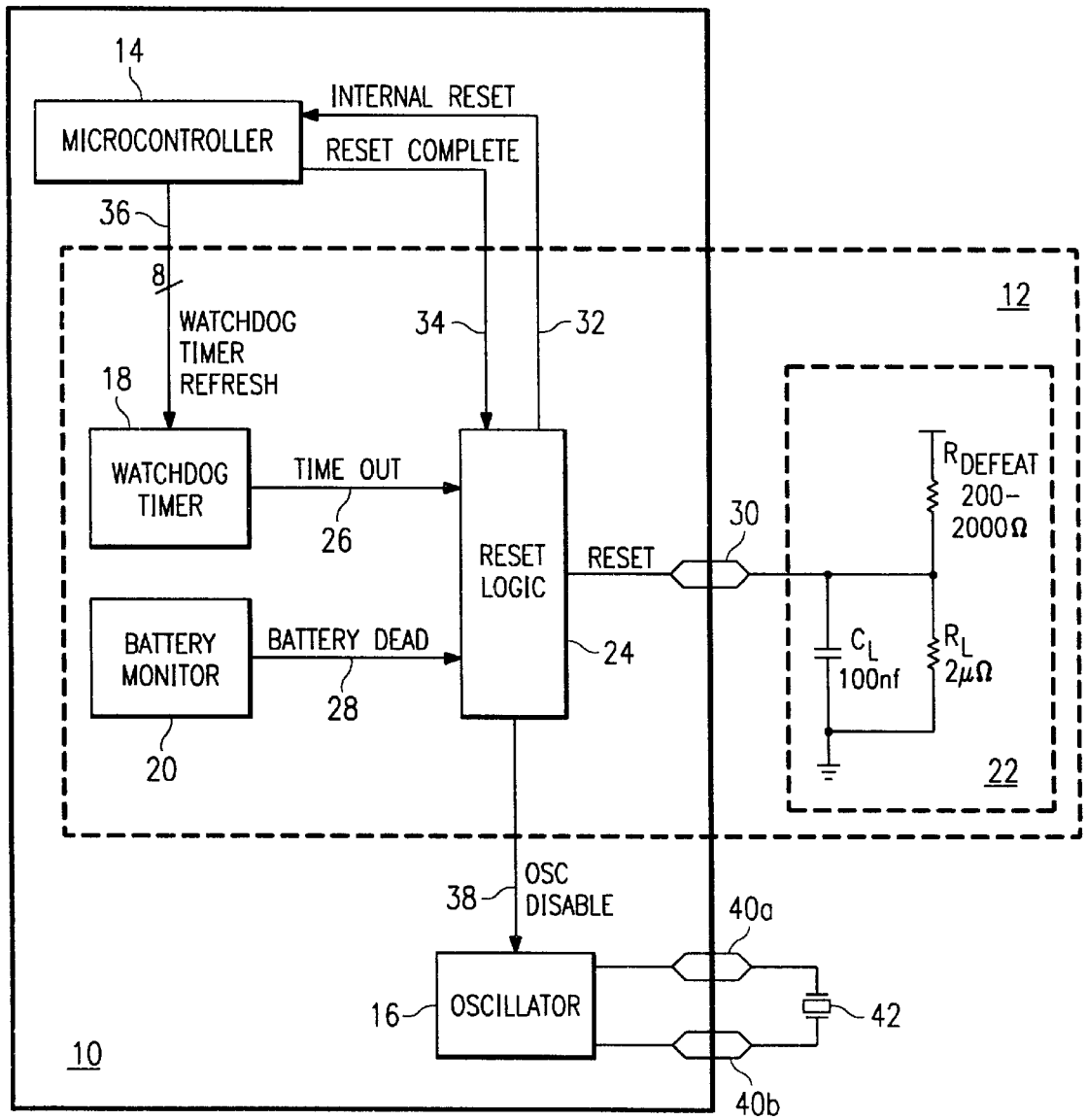
FIG. 1 is a schematic block diagram of an integrated circuit employing a reset circuit in accordance with the present invention.

Referring to FIG. 1, the reference numeral 10 refers in general to an integrated circuit employing a reset circuit 12 embodying features of the present invention. In the preferred embodiment, the integrated circuit 10 is designed in any conventional manner for use in a wireless communication device and comprises the reset circuit 12, which is in communication with a microcontroller circuit 14 and an oscillator circuit 16, for purposes that will be described.

The reset circuit 12 is comprised of a watchdog timer 18, a battery monitor 20, and a passive pulldown, or level adjustment, circuit 22 external to the integrated circuit 10, all connected to reset logic 24. As one skilled in the art will readily appreciate, the software being executed by the microcontroller 14 is designed to cause the microcontroller 14 to periodically refresh the watchdog timer 18 to ensure that the microcontroller 14 and software processed by the microcontroller 14 are operating properly. If the microcontroller 14 fails to refresh the watchdog timer 18 within the prescribed period, the watchdog timer 18 outputs a timeout signal 26 to the reset logic 24 indicating that the watchdog timer 18 has not been properly refreshed by the microcontroller 14.

The battery monitor 16 is designed in a conventional manner to monitor the charge level of a battery (not shown)

used to supply power to the integrated circuit 10. When the battery monitor 20 detects that the charge level of the battery has fallen below a predetermined charge level, it generates a dead battery signal 28 to the reset logic 24 for purposes that will be described.

The passive pulldown circuit 22 is located external to the integrated circuit 10 and is connected to the reset logic 24 through reset pin 30. The passive pulldown circuit 22 is comprised of the parallel combination of capacitor $C_L$ and resistor $R_L$ connected to ground. The passive pulldown circuit 22 may optionally contain a pullup resistor $R_{DEFEAT}$ connected between the reset pin 30 and $V_{CC}$ for purposes that will be described.

The reset circuit 12 communicates with the microcontroller 14 by an internal reset signal 32 to the microcontroller 14 and by a reset complete signal 34 to the reset logic 24. It is understood that the internal reset signal 32 and reset complete signal 34 may be connected to additional components on or off of the integrated circuit 10 to force the integrated circuit 10, or other components, into a known default state. The microcontroller 14 also communicates with the watchdog timer 18 by an 8-bit watchdog timer refresh signal 36 to the watchdog timer 18.

The reset circuit 12 additionally communicates with the oscillator 16 by an oscillator disable signal 38 generated by the reset logic 24. The oscillator 16 is similarly connected to oscillator pins 40a and 40b. A crystal 42 is connected external to the integrated circuit 10 to oscillator pins 40a and 40b to provide internal timing for the microcontroller 14.

Further, the reset circuit 12 communicates externally to the integrated circuit 10 by a bi-directional, reset signal 44 connected to reset pin 30. As in any conventional integrated circuit, the reset pin 30 protrudes from the integrated circuit 10 for connection to external components. In the embodiment shown, it is understood that the reset signal 44 is an active low signal.

Figure 2:
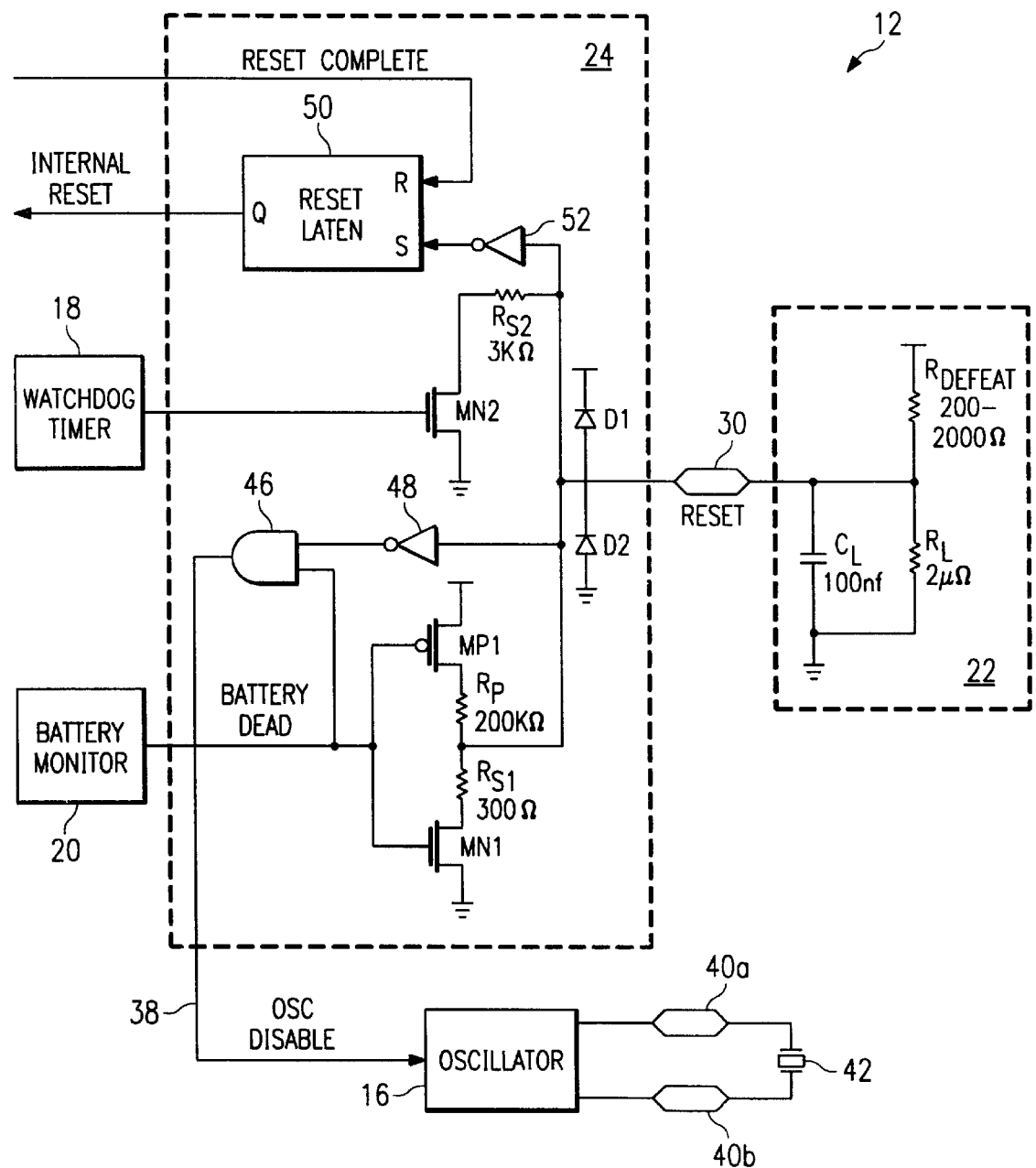
FIG. 2 is a detailed schematic block diagram of the reset circuit of FIG. 1.

FIG. 2 shows a detailed schematic of the reset circuit 12, and particularly the reset logic 24, according to the present invention. Within the reset circuit 12, the battery dead signal 28 of the battery monitor 20 is connected to the gate of p-channel field effect transistor (FET) MP1 and the gate of n-channel FET MN1. The source of FET MP1 is connected to $V_{CC}$ and the drain of FET MP1 is connected to the reset pin 30 through pull up resistor $R_P$. The source of FET MN1 is connected to the reset pin 30 through resistor $R_{S1}$ and the drain of FET MN1 is connected to ground.

The dead battery signal 28 of the battery monitor is also connected as one input to AND gate 46. The other input of AND gate 46 is connected to the inverted reset signal 44 through inverter 48. The output of AND gate 44 is connected to the oscillator 16 and serves as an oscillator disable signal 38.

The timeout signal 26 of the watchdog timer 18 is connected to the gate of n-channel FET MN2. The drain of FET MN2 is connected to the reset pin 30 through resistor $R_{S2}$ and the source of FET MN2 is connected to ground.

An RS latch 50 is used to provide at its Q output the internal reset signal 32 to the microcontroller 14. The S input of the RS latch 50 is the inverted reset signal 44 generated by inverter 52. The R input of the RS latch 50 is connected to the reset complete signal 34 generated by the microcontroller 14.

Diode D1 is connected between the reset pin 30 and $V_{CC}$, and diode D2 is connected between the reset pin 30 and ground. Diodes D1 and D2 are provided to protect against electrostatic discharge. D1 also safely discharges the load capacitance to $V_{CC}$ in the event of a sudden drop in the $V_{CC}$ level.

In operation, the charge level of the battery is ordinarily above a predetermined charge level, such that the battery monitor 20 generates a low dead battery signal 28 to the gates of FETs MN1 and MP1. With a low battery dead signal 28 present at the gate of FET MN1, FET MN1 is turned off, prohibiting any current from flowing through $R_{S1}$ to ground. However, with a low dead battery signal 28 present at the gate of FET MP1, FET MP1 is turned on such that current flows from $V_{CC}$ through both $R_P$ and the passive pull down circuit 22 to ground. With MP1 turned on, the resistor divider created by $R_P$ and $R_L$ causes a high reset signal 44, indicating that a reset is not requested.

A low dead battery signal 28 also causes the AND gate 46 to generate a low oscillator disable signal 38, which permits the various clocks and the microcontroller 14 on the integrated circuit 10 to continue operation.

With the battery in a sufficiently charged state, the microcontroller 14 is free to operate and must refresh the watchdog timer 18 periodically to prevent the generation of the timeout signal 26. In the present invention, the microcontroller 14 must write a specific sequence of bits to the watchdog timer 18 on the line 36 to refresh the watchdog timer 18. In normal operations, the watchdog timer 18 is properly refreshed and generates a constant low time out signal 26 to the gate of FET MN2. With a low signal present at the gate of FET MN2, FET MN2 is turned off, prohibiting current from flowing through $R_{S2}$ to ground, which enables $R_P$ and $R_L$ to maintain the reset signal 44 at a high level.

If the microcontroller 14 fails to write the specified sequence to the watchdog timer 18, the watchdog timer then pulses the time out signal 26 high. When a high time out signal 26 is present at the gate of FET MN2, FET MN2 is turned on, which permits current to flow through $R_{S2}$ to ground. If the battery monitor 20 is generating a low dead battery signal 28, current will flow from $V_{CC}$ through $R_P$ and through the parallel combination of $R_{S2}$ and $R_L$. The value of $R_{S2}$ is chosen to assure that the resistor divider created by $R_P$ and the parallel combination of $R_{S2}$ and $R_L$ causes a low reset signal 44, indicating that a reset is requested. Further, the value of $C_L$ is chosen such that the time constant of the discharge of $C_L$ is smaller than the duration of the time out signal 26 to assure that the reset signal 44 will arrive at a low level before MN2 is turned off.

With the reset signal 44 low, the S input of RS latch 50 is driven high by inverter 52, thus causing the Q output of RS latch 50 to go high. This signals the microcontroller 14 that a reset has been requested and the microcontroller 14 goes through its reset sequence. By utilizing the RS latch 50, the reset logic 24 is effectively able to extend the duration of the internal reset signal 32 until the microcontroller 14 has completed its reset operations. Further, the use of RS latch 50 protects against repeated resets, or other unpredictable operations, which might be caused by a noisy reset signal 44. When the microcontroller 14 has completed its reset sequence, it pulses the reset complete signal 34 high, which drives the R input of RS latch 50 high and causes the Q output to change to a low level. If the reset signal 44 is still at a low level, the Q output will again change to a high level and the microcontroller 14 will repeat its reset sequence. Normally, however, the reset signal 44 will have changed to a high level, as a result of FET MN2 being turned off, and the microcontroller 14 will proceed with normal operations.

When the battery monitor 20 detects that the charge level of the battery has fallen below a predetermined value, the battery monitor 20 generates a high dead battery signal 28 at the gates of FETs MP1 and MN1, which turns off FET MP1 and turns on FET MN1. With MN1 turned on, the charge stored in $C_L$ is discharged through $R_L$ and $R_{S1}$ to ground, causing a low reset signal 44 which indicates that a reset is requested. In this condition, both of the inputs to AND gate 46 are high, resulting in a high oscillator disable signal 38 that causes the clocks on the integrated circuit 10 to stop functioning and effectively halts the microcontroller's 14 operations. While the presence of a low reset signal 44 will cause the Q output of RS latch 50 to go high, since the microcontroller 14 has ceased operating, the internal reset signal 32 has no practical effect in this condition.

Since the oscillator disable signal 38 is only high when both the dead battery signal 28 and the reset signal 44 are true, the oscillator 16 is only disabled if the battery is dead, and is not affected by the watchdog timer timeout. It is understood that the oscillator 16 is disabled to conserve energy when the battery has fallen below a critical level. By only disabling the oscillator 16 in a dead battery condition, the oscillator 16 does not have to recycle and spin up for every reset.

The passive pulldown circuit 22, consisting of capacitor $C_L$ and $R_L$ are specifically designed to discharge any voltage built up on $C_L$ in the event that power is lost to the integrated circuit 10 in such a manner that none of the FETs MP1, MN1 or MN2 are operational.

Additionally, by making the reset signal 44 bi-directional, it is possible to force the integrated circuit 10 into reset by pulling the reset signal 44 low using external circuitry (not shown) attached to reset pin 30.

$R_{DEFEAT}$ may be optionally used to assist in testing of the integrated circuit 10. With an appropriately chosen value of $R_{DEFEAT}$, the value of the reset signal 44 can be maintained at a high level regardless of whether any of the FETs MP1, MN1 or MN2 are active. For example, during testing of the integrated circuit 10, the watchdog timer 18 may not be refreshed and will attempt to cause a reset. This is undesirable because repeated resets would prevent sufficient testing of the integrated circuit 10. Further, during testing it may be desirable to allow oscillator 16 to continue operation even when the battery monitor 20 has detected a low battery level. Accordingly, by the use of $R_{DEFEAT}$ tied to $V_{CC}$, to hold the reset signal 44 high, AND gate 46 will not generate a high oscillator disable signal 38 even if the battery monitor 20 detects a low battery condition. As one skilled in the art will readily appreciate, it is possible to select a value for $R_{DEFEAT}$ which will hold the reset signal 44 high during a watchdog timer 18 time out and yet allow the reset signal 44 to drop low when a dead battery signal 28 occurs.

The present invention has several advantages. For example, by causing the integrated circuit 10 to reset when the software is not operating properly, as well as when the battery has fallen below a predetermined charge level, the integrated circuit prevents the transmission of undesirable electromagnetic signals.

Further, by integrating the battery monitor 20 and the watchdog timer 18 into the integrated circuit 10 in connection with the reset logic 24, an external battery monitor 20 is not required. This reduces interconnectivity between the integrated circuit 10 and the board on which it is placed, saving overall board space and reducing the number of required external components.

Further, through the utilization of a passive pulldown circuit 36, the reset signal 44 will be brought low if none of the FETs MN1, MN2 and MP1 is functioning.

Moreover, AND gate 46 enables the oscillator 16 to be disabled only when the battery is dead and the reset is not overridden externally.

It is understood that several variations may be made in the foregoing without departing from the scope of the invention. For example, the integrated circuit need not be specifically designed for use in wireless communications. Additionally, AND gate 46 may have any number of additional inputs, the values for the various resistors and capacitors may differ, and different logic circuits may be utilized.

Although illustrative embodiments of the invention have been shown and described, a wide range of modification, change, and substitution is contemplated in the foregoing disclosure and in some instances, some features of the present invention may be employed without a corresponding use of the other features. Accordingly, it is appropriate that the appended claims be construed broadly and in a manner consistent with the scope of the invention.

What is claimed is:

1. A reset circuit for use in an integrated circuit, the reset circuit comprising:

an oscillator circuit having an oscillator disable input;

a battery monitor arranged to detect that a charge level of the battery has fallen below a predetermined charge level and having an output for indicating a charge state of a battery;

a watchdog timer having an output for indicating an operational state of software operating on the integrated circuit; and reset logic circuitry coupled to receive the battery monitor output and the watchdog timer output and having an oscillator disable output coupled to the oscillator disable input and a reset signal output, the reset logic circuitry being configured and arranged to generate an oscillator disable signal on the oscillator disable output to disable the oscillator when both the battery monitor output and the reset signal output are active, and the reset logic circuitry further configured and arranged to generate the reset signal output if the battery monitor output or the watchdog timer output is active.

2. The reset circuit of claim 1, further comprising a level adjustment circuit connected to the reset signal output.

3. The reset circuit of claim 2, wherein the level adjustment circuit comprises circuitry external to the integrated circuit.

4. The reset circuit of claim 2, wherein the level adjustment circuit comprises only passive elements.

5. The reset circuit of claim 2, further comprising a reset defeat circuit electrically connected to the reset signal output for preventing the reset logic from generating the reset signal.

6. The reset circuit of claim 2, further comprising a reset defeat circuit electrically connected to the reset signal output for preventing the reset logic from generating the reset signal when the watchdog timer output is active but allowing the reset logic to generate the reset signal when the battery monitor output is active.

7. The reset circuit of claim 1, further comprising a reset defeat circuit electrically connected to the reset signal output for preventing the reset logic from generating the oscillator disable signal.

8. The reset circuit of claim 1, further comprising a reset extension circuit connected to receive the reset signal and having a secondary reset signal output, wherein upon receiving the reset signal, a secondary reset signal generated at the secondary reset signal output remains set for a minimum time period.

9. The reset circuit of claim 8, further comprising a microcontroller having a reset complete output connected to the reset extension circuit, wherein the secondary reset signal remains set until the reset extension circuit receives a reset complete signal on the reset complete output.

10. The reset circuit of claim 1, further comprising a first and second diode connected to the reset signal output to protect against electrostatic discharge.

11. The reset circuit of claim 1, wherein the integrated circuit is used in a wireless communication device.

12. A reset circuit for use in an integrated circuit having a microcontroller and an oscillator, the integrated circuit being powered by a battery, the reset circuit comprising:

a battery monitor for generating an output signal for indicating a low charge of the battery;

a watchdog timer for generating an output signal for indicating an operational state of the microcontroller; and reset logic connected to receive the battery monitor output signal and the watchdog timer output signal and having a reset signal output, wherein when the battery monitor output signal is active, the reset logic disables the oscillator and resets the microcontroller and when the watchdog timer output signal is active, the reset logic resets the microcontroller but does not disable the oscillator.

13. The reset circuit of claim 12, further comprising a reset defeat circuit electrically connected to the reset signal output for preventing the reset logic from disabling the oscillator.

14. The reset circuit of claim 12, further comprising a level adjustment circuit connected to the reset signal output.

15. The reset circuit of claim 14 wherein the level adjustment circuit comprises circuitry external to the integrated circuit.

16. The reset circuit of claim 14, wherein the level adjustment circuit comprises only passive elements.

17. The reset circuit of claim 14, further comprising a reset defeat circuit electrically connected to the reset signal output for preventing the reset logic from generating the reset signal.

18. The reset circuit of claim 14, further comprising a reset defeat circuit electrically connected to the reset signal output for preventing the reset logic from generating the reset signal when the watchdog timer output is active.

19. The reset circuit of claim 12, further comprising a reset extension circuit for receiving the reset signal and having a secondary reset signal output, wherein upon receiving the reset signal, a secondary reset signal at the secondary reset signal output remains set for a minimum time period.

20. The reset circuit of claim 19, wherein the microcontroller has a reset complete output connected to the reset extension circuit, wherein the secondary reset signal remains set until the reset extension circuit receives the reset complete signal on the reset complete output.

21. The reset circuit of claim 12, further comprising a first and second diode connected to the reset signal output to protect against electrostatic discharge.

22. The reset circuit of claim 12, wherein the integrated circuit is used in a wireless communication device.

23. A reset circuit in an integrated circuit having a microcontroller and an oscillator, the integrated circuit powered by a battery, the reset circuit comprising:

means for monitoring a charge state of the battery;

means for monitoring an operational state of the microcontroller;

means for activating a reset signal when the charge monitoring means indicates a low charge of the battery or the microcontroller monitoring means indicates a predetermined operational state of the microcontroller; and means for disabling the oscillator only when both the battery monitoring means indicates a low charge of the battery and the reset signal is active.

24. The reset circuit of claim 23, further comprising means for adjusting a level of the reset signal.

25. The reset circuit of claim 23, further comprising means for preventing generation of the reset signal.

26. The reset circuit of claim 23, further comprising means for asserting the reset signal until it is released by the microcontroller.

27. A method for implementing a reset operation in an integrated circuit having a microcontroller and an oscillator, the integrated circuit powered by a battery, the method comprising:

monitoring a charge state of the battery;

monitoring an operational state of the microcontroller;

generating a reset signal when the charge monitoring indicates a low charge of the battery or the microcontroller monitoring indicates an error in the operational state of the microcontroller; and disabling the oscillator only when both the battery monitoring means indicates a low charge of the battery and the reset signal is generated.

28. The method of claim 27, further comprising adjusting a level of the reset signal.

29. The method of claim 27, further comprising preventing generation of the reset signal.

30. The reset circuit of claim 27, further comprising asserting the reset signal until it is released by the microcontroller.

* * * * *